(12) United States Patent
Yamada et al.

(10) Patent No.: US 6,634,004 B1
(45) Date of Patent: Oct. 14, 2003

(54) THRESHOLD ANALYSIS SYSTEM CAPABLE OF DECIDING ALL THRESHOLD VOLTAGES INCLUDED IN MEMORY DEVICE THROUGH SINGLE PROCESSING

(75) Inventors: Shinji Yamada, Hyogo (JP); Hisaya Mori, Hyogo (JP); Teruhiko Funakura, Hyogo (JP)

(73) Assignees: Mitsubishi Denki Kabushiki Kaisha, Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 465 days.

(21) Appl. No.: 09/706,696

(22) Filed: Nov. 7, 2000

(30) Foreign Application Priority Data

Apr. 28, 2000 (JP) ........................................ 2000-130066

(51) Int. Cl.⁷ ............................................... G11C 29/00
(52) U.S. Cl. ............................... 714/721; 714/42; 716/4
(58) Field of Search .......................... 716/4–6; 714/721, 714/42

(56) References Cited

U.S. PATENT DOCUMENTS 5,500,824 A * 3/1996 Fink ........................... 365/201
6,243,839 B1 * 6/2001 Roohparvar ................. 714/718

FOREIGN PATENT DOCUMENTS

| JP | 4-195899 | | 7/1992 | |
| JP | 04195899 A | * | 7/1992 | ........... G11C/17/00 |
| JP | 8-297982 | | 11/1996 | |
| JP | 08297982 A | * | 11/1996 | ........... G11C/16/04 |
| JP | 2001312898 A | * | 11/2001 | ........... G11C/29/00 |

OTHER PUBLICATIONS

Khubchandani, R.; A fast test to generate flash memory threshold voltage distribution map: Records of the 1999 IEEE International Workshop on Memory Technology, Design and Testing, Aug. 9–10, 1999; pp. 78–82.*

* cited by examiner

*Primary Examiner*—R Stephen Dildine
(74) *Attorney, Agent, or Firm*—McDermott, Will & Emery

(57) ABSTRACT

In a threshold analysis method obtaining threshold voltages of all bits in a flash memory through single processing, fail bit map information is examined in order from a smaller voltage applied to the flash memory. As to a bit exhibiting a value, read from the flash memory, first mismatching a determination value, the threshold voltage is settled on the basis of a voltage applied when the bit fails in reading.

16 Claims, 16 Drawing Sheets

FIG. 3
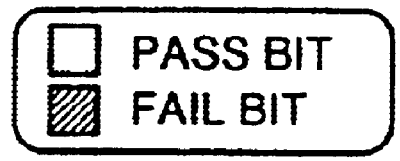
PASS BIT
FAIL BIT
FAIL BIT MAP INFORMATION0
(APPLY V0 TO WORD LINE)
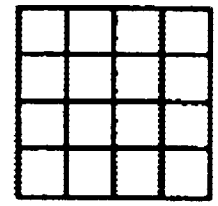
FAIL BIT MAP INFORMATION1
(APPLY V1 TO WORD LINE)
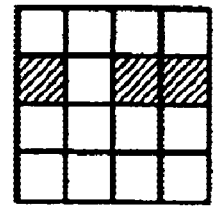
FAIL BIT MAP INFORMATION2
(APPLY V2 TO WORD LINE)
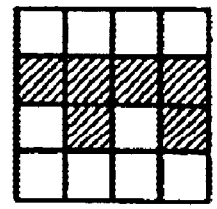
FAIL BIT MAP INFORMATION3
(APPLY V3 TO WORD LINE)
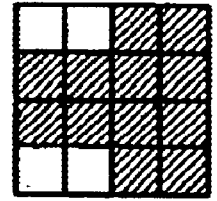
FAIL BIT MAP INFORMATION4
(APPLY V4 TO WORD LINE)
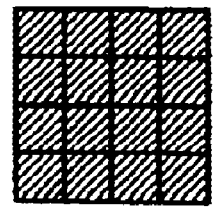

FIG. 8
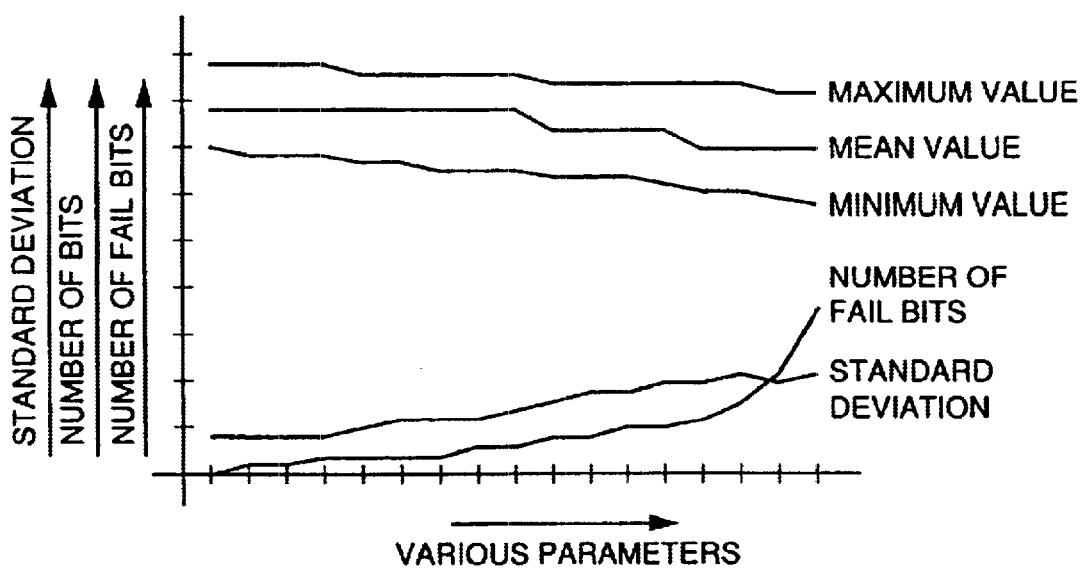
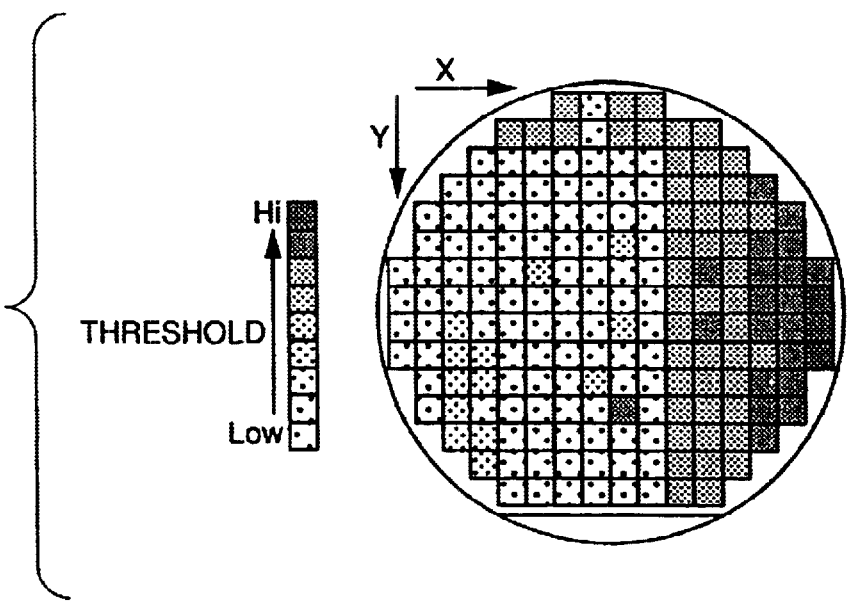
FIG. 9

THRESHOLD ANALYSIS SYSTEM CAPABLE OF DECIDING ALL THRESHOLD VOLTAGES INCLUDED IN MEMORY DEVICE THROUGH SINGLE PROCESSING

BACKGROUND OF THE INVENTION

1. Field of the Invention

The present invention relates to a threshold analysis system and a threshold analysis method, and more particularly, it relates to a threshold analysis system and a threshold analysis method capable of deciding threshold voltages of all cells included in a memory device through single processing.

2. Description of the Background Art

In design evaluation of a flash memory, threshold voltage distribution of transistors must be obtained by applying temperature stress or the like, in order to guarantee the quality of the product. In particular, it is important to efficiently calculate threshold voltages to catch up with the recent increase of the capacity of the flash memory.

The threshold voltage is the minimum voltage for feeding a current to each transistor. In general, the threshold voltage can be detected by changing the voltage level of a word line connected to the gate of the transistor at regular intervals and confirming whether or not the transistor is rendered conductive.

Japanese Patent Laying-Open No. 4-195899 (1992) discloses a method of automatically generating a voltage applied to the gate of a transistor while employing binary search for efficiently detecting the threshold voltage.

In the method disclosed in Japanese Patent Laying-Open No. 4-195899, however, the threshold voltage is obtained bit by bit. In this method, therefore, it takes much time to obtain threshold voltages of a bulk flash memory, leading to inferior efficiency.

Even if a result of processing is obtained, it is difficult for a user to grasp a tendency such as dispersion of the process.

SUMMARY OF THE INVENTION

Accordingly, an object of the present invention is to provide a threshold analysis system and a threshold analysis method capable of efficiently calculating threshold voltages of a memory device such as a flash memory.

Another object of the present invention is to provide a threshold analysis system capable of expressing the tendency of threshold voltages that is readily grasped.

A threshold analysis system according to an aspect of the present invention includes a signal generation circuit generating a plurality of types of voltages and sequentially applying each of the plurality of types of voltages to a plurality of cells forming a memory device, an address generator sequentially generating address signals specifying the respective ones of the plurality of cells, a memory storing data read from the memory device as fail bit map information as to each of the plurality of types of voltages, and a threshold voltage calculation part connected to the memory for calculating threshold voltages of the plurality of cells forming the memory device from a plurality of pieces of fail bit map information corresponding to the plurality of types of voltages.

The threshold analysis system calculates the threshold voltages of the plurality of cells on the basis of the plurality of pieces of fail bit map information. Therefore, the threshold analysis system can simultaneously calculate the threshold voltages of the respective cells in the memory device, for efficiently calculating the threshold voltages.

Preferably, the signal generation circuit and the address generator are formed by a signal generation circuit and a pattern generator included in a memory tester respectively, while the memory and the threshold voltage calculation part are formed by a fail memory and a central processing unit included in a repair analysis device respectively.

The threshold analysis system is formed by the memory tester and the repair analysis device. Therefore, threshold analysis can be made through general purpose devices, with no requirement for specific hardware.

More preferably, each of the plurality of pieces of fail bit map information has a prescribed size, and is stored in a continuous area of the fail memory.

The size of the fail bit map information is preset and the fail bit map information is continuously stored. Assuming that the size of the fail bit map information is expressed as OffsetAdrs and the head address of the first fail bit map information is 0, therefore, the head address of i-th fail bit map information can be expressed as $(i-1) \times OffsetAdrs$. Thus, each fail bit map information can be readily accessed.

More preferably, the memory has a two-bank memory structure for alternating banks every time a voltage applied to the memory device is changed and writing fail bit map information in one of the banks with reference to fail bit map information stored in another bank.

The memory writes the fail bit map information in one of the banks with reference to the fail bit map information stored in another bank. Data may not be reread in relation to a cell failing in data reading. Therefore, the fail bit map information can be created at a high speed.

More preferably, the signal generation circuit is formed by a signal generation circuit included in a memory tester, and the address generator and the threshold voltage calculation part are formed by a digital signal processor.

The threshold analysis system is formed by the memory tester and the digital signal processor. Therefore, threshold analysis can be made through general purpose devices, with no requirement for specific hardware.

More preferably, the threshold analysis system further includes a threshold display part connected to the threshold voltage calculation part for visually displaying the threshold voltages of the plurality of cells.

The threshold analysis system can visually express the threshold voltages. Therefore, a user can readily grasp a tendency such as dispersion of the process.

More preferably, the threshold display part includes a difference value calculation part for calculating a difference value between threshold voltages obtained under two states having different conditions and a difference value display part connected to the difference value calculation part for visually displaying the difference value.

A cell exhibiting a large difference value can be determined as faulty by visually expressing the difference value between the threshold voltages.

A threshold analysis method according to another aspect of the present invention is employed in a threshold analysis system including a signal generation circuit generating a plurality of types of voltages and sequentially applying each of the plurality of types of voltages to a plurality of cells forming a memory device, an address generator sequentially generating address signals specifying the respective ones of the plurality of cells, a memory storing data read from the memory device as fail bit map information as to each of the plurality of types of voltages and a threshold voltage calculation part connected to the memory for calculating threshold voltages of the plurality of cells forming the memory device from a plurality of pieces of fail bit map information corresponding to the plurality of types of voltages. The threshold analysis method includes steps of sequentially applying each of the plurality of types of voltages to the plurality of cells, sequentially generating the address signals specifying the respective ones of the plurality of cells, storing data read from the memory device as fail bit map information as to each of the plurality of types of voltages and calculating threshold voltages of the plurality of cells forming the memory device from the plurality of pieces of fail bit map information stored in the memory.

The threshold voltages of the plurality of cells are calculated on the basis of the plurality of pieces of fail bit map information. Therefore, the threshold voltages of the respective cells in the memory device can be simultaneously calculated, for efficiently calculating the threshold voltages.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a diagram for illustrating fail bit map information;

FIG. 8 illustrates an exemplary threshold characteristic analysis graph;

FIG. 9 illustrates an exemplary threshold wafer bit map;

DESCRIPTION OF THE PREFERRED EMBODIMENTS

First Embodiment

Figure 1:
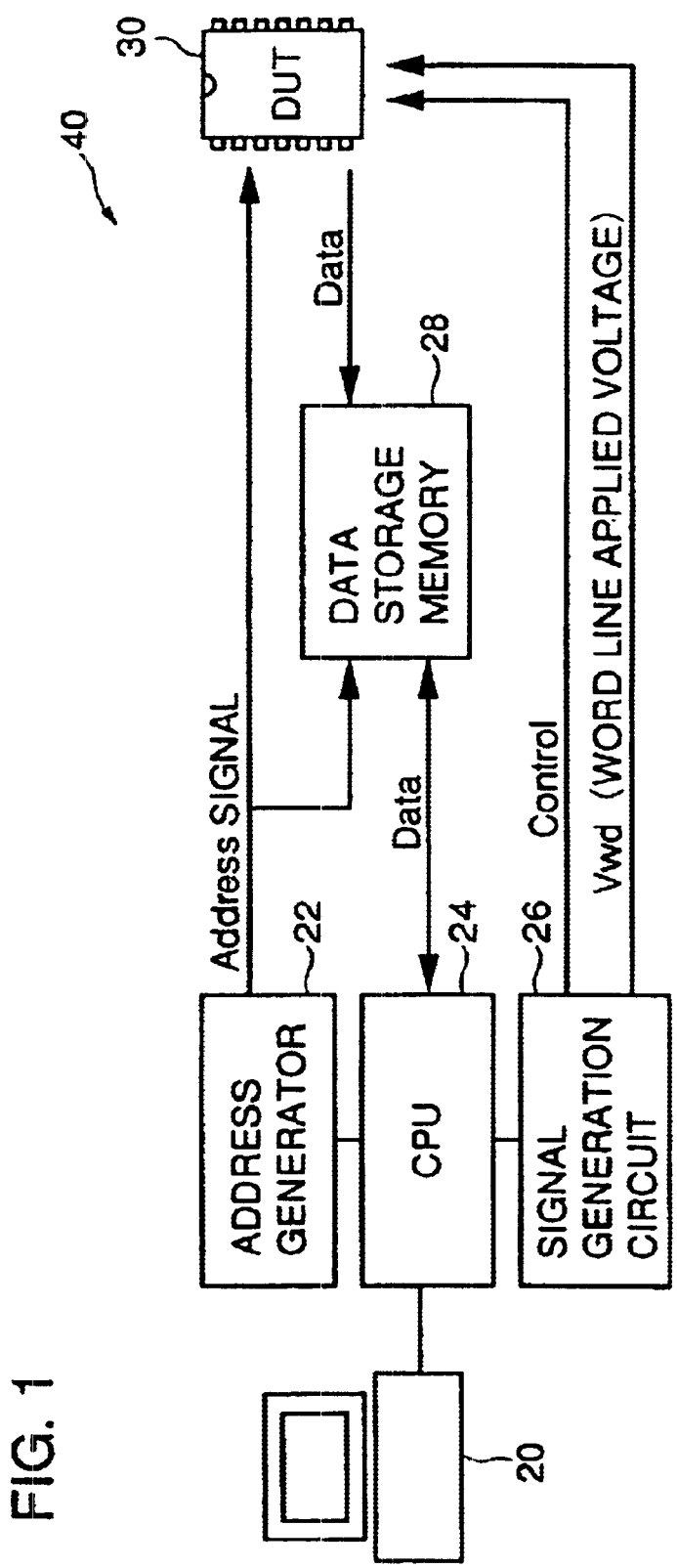
FIG. 1 is a block diagram showing the structure of a threshold analysis system according to a first embodiment of the present invention.

Referring to FIG. 1, a threshold analysis system 40 according to a first embodiment of the present invention includes a data storage memory 28 storing data for threshold analysis, an address generator 22 generating an address signal and supplying the address signal to a DUT (device under test) 30 such as a flash memory and the data storage memory 28, a signal generation circuit 26 generating a control signal for controlling the DUT 30 and a voltage (hereinafter referred to as "word line applied voltage") applied to a word line of each bit of the DUT 30 and supplying the control signal and the word line applied voltage to the DUT 30, a CPU (central processing unit) 24 connected to the address generator 22, the signal generation circuit 26 and the data storage memory 28 for controlling each element of the threshold analysis system 40 and calculating a threshold voltage of each bit forming the DUT 30, and a host computer 20 connected to the CPU 24 for displaying the result of the calculated threshold voltage.

A general flow of processing executed by the threshold analysis system 40 is described with reference to FIG. 2. A plurality of word line applied voltages are supplied to the word line of each bit forming the flash memory, for obtaining fail bit map information indicating whether or not read bit data matches a determination value as to each word line applied voltage (S2). Threshold information of each bit is obtained from a plurality of pieces of fail bit map information (S4). The host computer 20 manipulates the obtained threshold information and displays the same on its display screen (S6).

Figure 2:
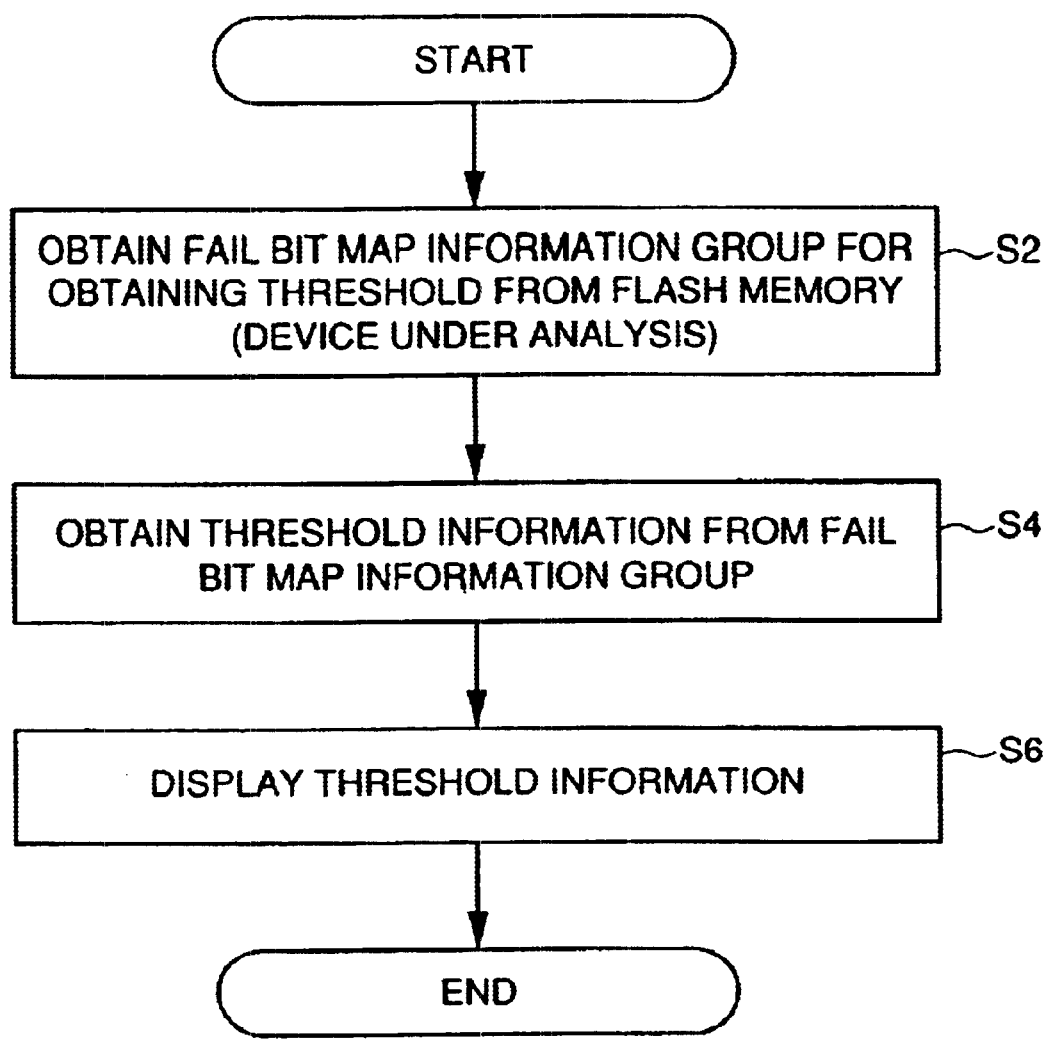
FIG. 2 is a flow chart of threshold analysis processing.

The processing at S2 in FIG. 2 is described hereinafter. The signal generation circuit 26 sequentially applies word line applied voltages V0 to V4 to the word lines of the bits forming the DUT 30. Each word line applied voltage Vn can be expressed as follows:

$$Vn = V0 + n \times Vstep \, (n=0 \text{ to } 4, Vstep > 0) \quad (1)$$

Fail bit map information as to partial bits (4×4=16 bits) of the DUT 30 is described with reference to FIG. 3. The CPU 24 previously fixes the determination value to a low or high level. The signal generation circuit 26 applies the word line applied voltage V0 to the word line of each bit of the DUT 30. The address generator 22 sequentially generates addresses of the DUT 30, and the data storage memory 28 stores values read through the word line applied voltage V0 as fail bit map information 0. Referring to FIG. 3, all bits supplied with the word line applied voltage V0 are pass bits, i.e., the read values are identical to the determination value.

The signal generation circuit 26 sequentially applies the word line applied voltages V1 to V4 to the DUT 30 similarly to the above. Fail bit map information 1 to fail bit map information 4 corresponding to the word line applied voltages V1 to V4 respectively are generated similarly to the above. For example, it is understood that three bits fail in the fail bit map information 1. It is also understood that all bits fail in the fail bit map information 4.

Figure 4:
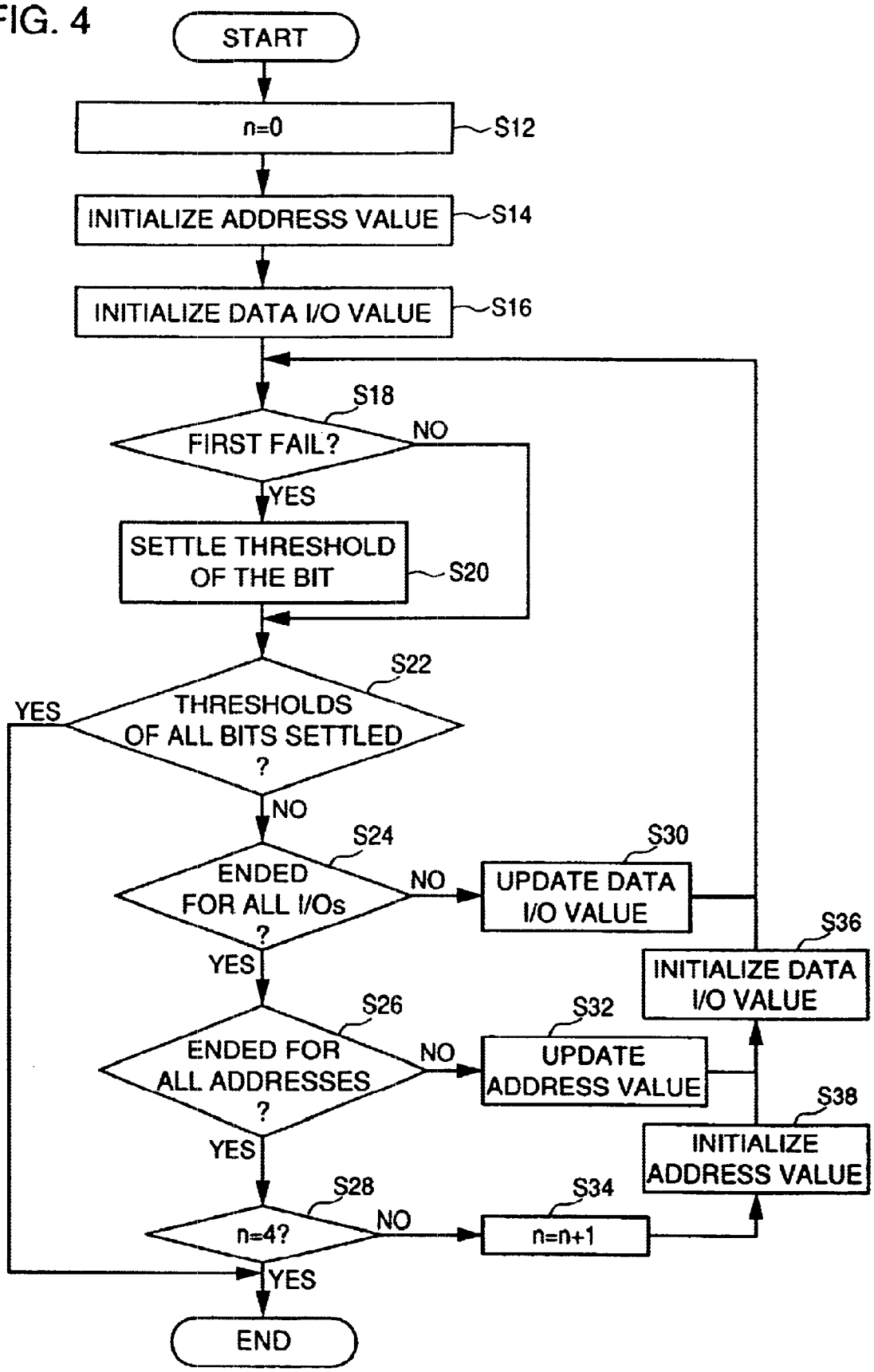
FIG. 4 is a flow chart of processing for obtaining threshold information.

The processing at S4 in FIG. 2 is hereinafter described with reference to FIG. 4. The CPU 24 initializes a variable n for specifying each word line applied voltage to zero (S12). The CPU 24 initializes an address value for specifying a word and a data I/O (input/output) value for specifying a bit in the word respectively (S14 and S16). In other words, the CPU 24 specifies a 0-th bit cell of a 0-th word. As to the noted bit, the CPU 24 examines whether or not data read when applying the word line applied voltage Vn first mismatches the determination value on the basis of the fail bit map information n (S18). When reading data first mismatching the determination value (YES at S18), the CPU 24 sets the threshold voltage of the bit to Vn (S20).

Otherwise (NO at S18) or after the processing at S20, the CPU 24 examines whether or not threshold voltages for all bits are settled (S22). If the threshold voltages for all bits are settled (YES at S22), the CPU 24 ends the processing.

Otherwise the CPU 24 examines whether or not the processing is completed as to all data I/Os of the noted word (S24). If there is any unprocessed bit (NO at S24), the CPU 24 updates the data I/O value (S30) and repeats S18 and the subsequent processing.

If the processing on the noted word is completed (YES at S24), the CPU 24 examines whether or not the processing is completed as to all addresses (all words) (S26). If there is any unprocessed address (NO at S26), the CPU 24 updates the address value (S32), initializes the data I/O value (S36) and thereafter repeats S18 and the subsequent processing.

If the processing is completed addresses (YES at S26), the CPU 24 examines whether or not n=4 (S28). If n=4 (YES at S28), the CPU 24 ends the processing of obtaining the threshold information.

If n≈4 (NO at S28), the CPU 24 increments the variable n by 1 for obtaining threshold voltage information with next fail bit map information (S34). Thereafter the CPU 24 initializes the address value and the data I/O value (S38 and S36), and repeats S18 and the subsequent processing.

Figure 5:
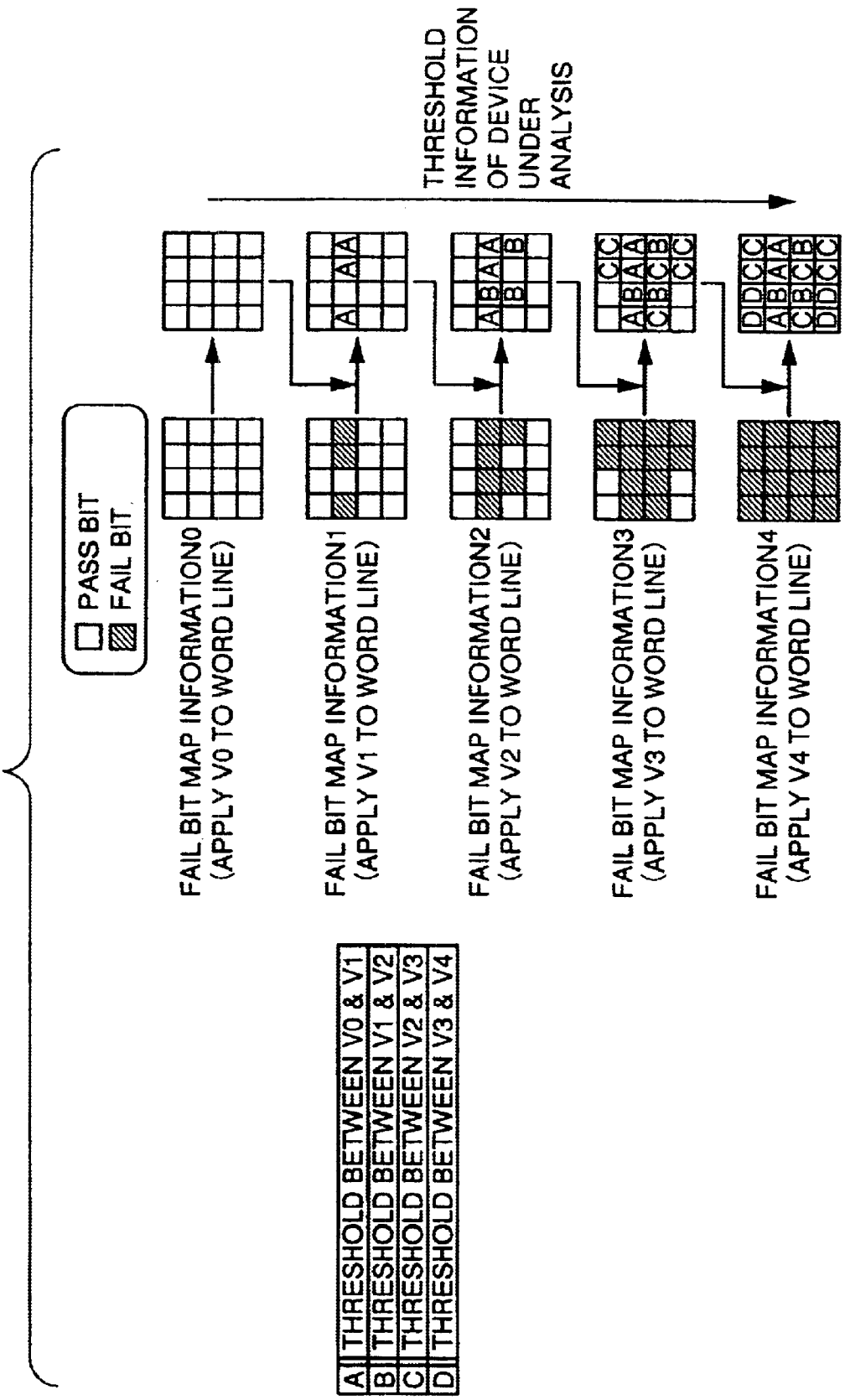
FIG. 5 is a diagram for illustrating the processing for obtaining threshold information.

It is assumed that fail bit map information shown in FIG. 5 is obtained, for example. It is also assumed that A to D represent threshold voltages in this case. When n=1, bits first failing in reading are extracted. These bits are supplied with the threshold voltage A between the voltages V0 and V1. When obtaining the threshold voltage of each bit while changing the variable n up to 4, any of the four voltages A to D is finally assigned to each bit.

The processing at S6 in FIG. 2 is hereinafter described with reference to FIG. 6. The host computer 20 counts the obtained threshold information for each threshold voltage and creates a graph (histogram) showing threshold voltages and numbers of bits on the horizontal and vertical axes respectively. The host computer 20 displays this graph on the display screen thereof. The graph may be displayed with colors varying with block addresses showing constant ranges of addresses or data I/O values. Alternatively, the colors may vary with each DUT 30 or each wafer.

The threshold voltages of the DUT 30 can be collectively obtained and the obtained threshold voltages can be displayed in a graph due to the aforementioned series of processing.

First Modification of Threshold Information Display Processing

Figure 6:
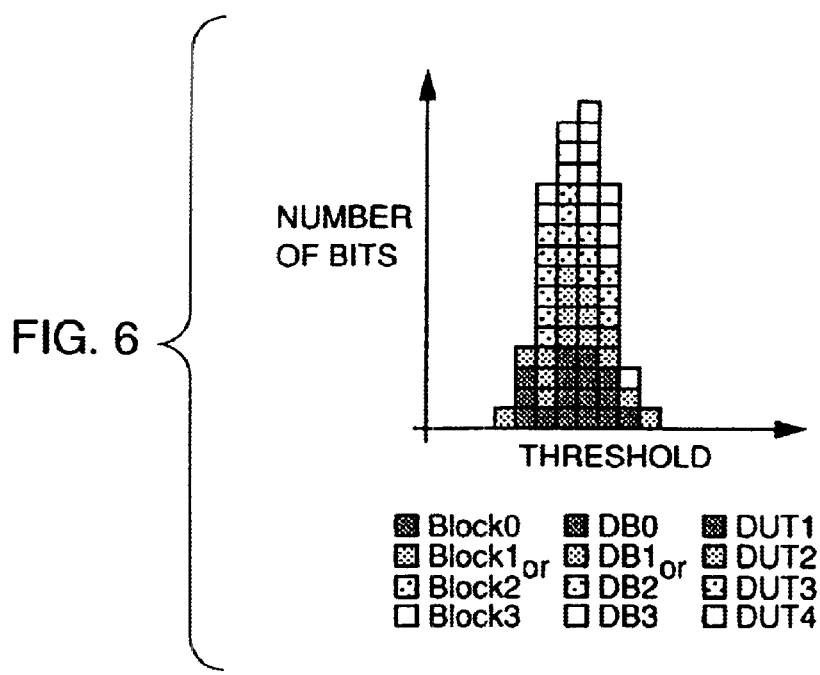
FIG. 6 illustrates an exemplary histogram of threshold voltages.
Figure 7:
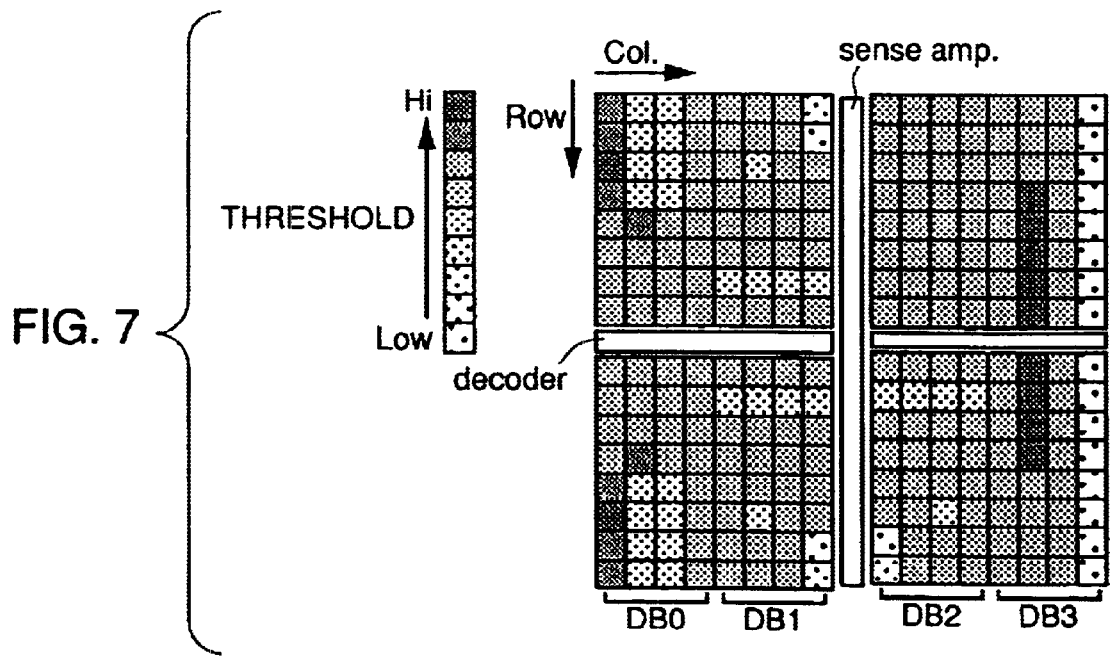
FIG. 7 illustrates an exemplary threshold distribution map.

A threshold distribution map shown in FIG. 7 may be displayed in place of the graph shown in FIG. 6. The threshold distribution map can express differences between threshold voltages with different colors for visually expressing distribution of the threshold voltages on a memory array. When the threshold distribution map is designed to be shown in a reduced scale, distribution of threshold voltages of a bulk memory device can be confirmed at a glance. The threshold distribution map expresses a plurality of bits in a single cell when reduced, and hence the threshold voltages are colored on the basis of the mean value, the maximum value or the minimum value of the threshold voltages of the plurality of bits.

Second Modification of Threshold Information Display Processing

A threshold characteristic analysis graph shown in FIG. 8 may be displayed in place of the graph shown in FIG. 6. This graph is created by obtaining characteristic values such as the maximum value, the minimum value, the mean value, standard deviation and the number of fail bits from a threshold information group acquired while varying the values of parameters such as the quantity of stress applied to the DUT 30, a measuring cycle and the power supply voltage for the DUT 30. The horizontal axis shows the values of the parameters and the vertical axis shows the values of the various characteristics.

When exhibiting the time for applying stress on the horizontal axis, for example, the data holdability of the DUT 30 can be quantitatively and visually expressed.

Third Modification of Threshold Information Display Processing

A threshold wafer bit map shown in FIG. 9 may be displayed in place of the graph shown in FIG. 6. A single cell corresponds to a single DUT 30, and the threshold wafer bit map expresses the mean value, the minimum value, the maximum value, standard deviation etc. of DUTs 30 in different colors. Thus, threshold information can be compared and analyzed in units of wafers, and a tendency of process dispersion can be detected from the tendency of the threshold voltages.

Fourth Modification of Threshold Information Display Processing

In order to verify the data holdability of the DUT 30 such as a flash memory, a floating gate of the flash memory may be set to a high potential for obtaining threshold information before and after applying stress such as a reverse bias or a temperature respectively and displaying change of the threshold information before and after application of the stress.

Figure 10:
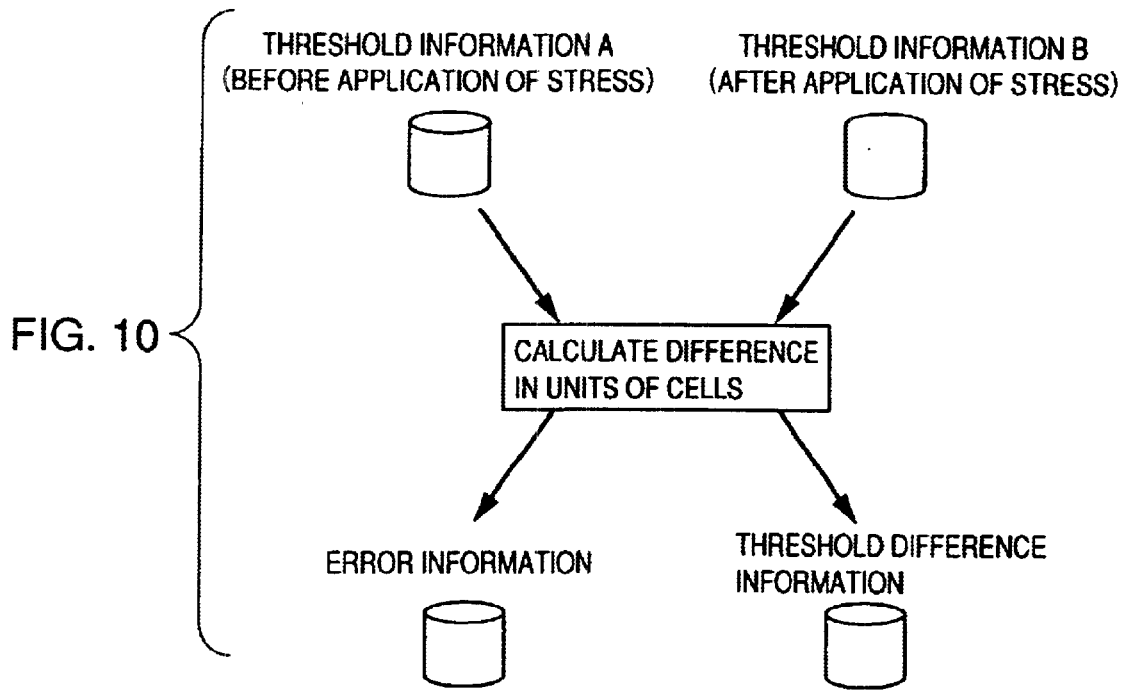
FIG. 10 is a diagram for illustrating processing of obtaining difference values of threshold voltages and error information of cells.
Figure 11:
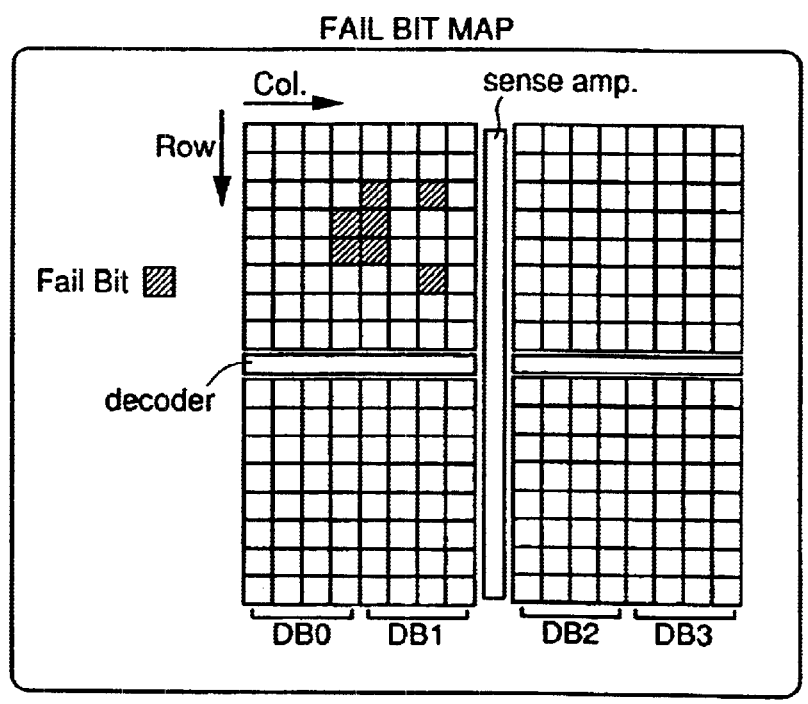
FIG. 11 is a diagram showing an exemplary fail bit map displaying error information to overlap on a map of a flash memory.

Referring to FIG. 10, difference values are calculated in units of cells between threshold information A before application of stress and threshold information B after application of stress. Cells exhibiting difference values greater than a prescribed threshold voltage are determined as faulty, and the positions of the faulty cells are stored as error information. Referring to FIG. 11, the faulty cells are displayed to overlap on a map of the flash memory on the basis of the error information. Thus, the user can specify the faulty portions and determine which process is faulty. Further, the user can detect a fail mode indicating whether the failures result from bit failures, line failures or cross-line failures etc.

Figure 12:
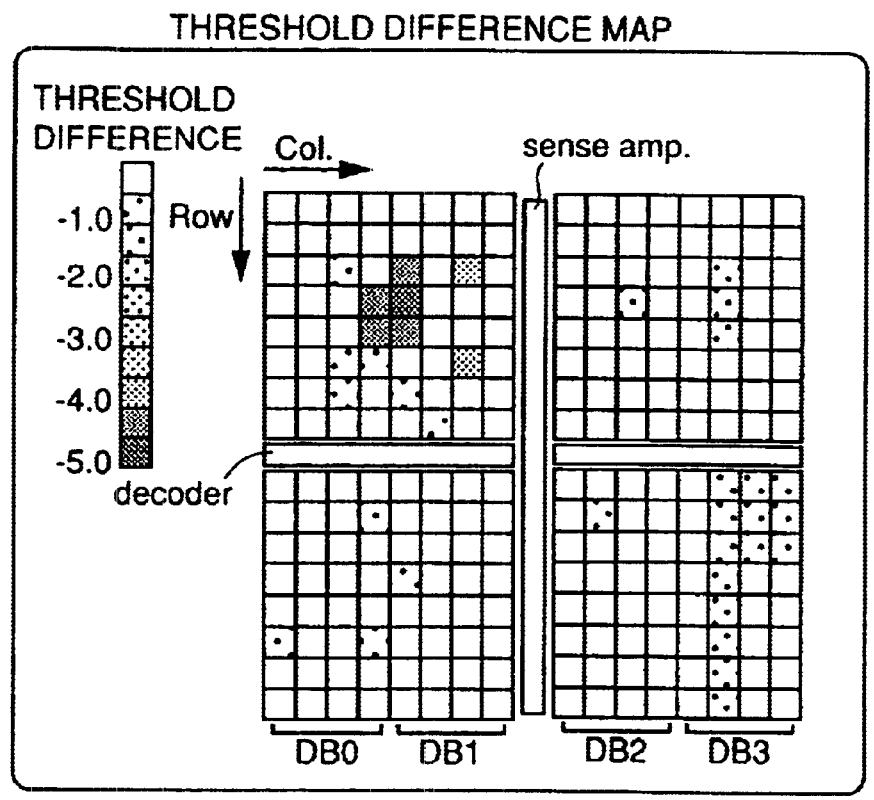
FIG. 12 is a diagram showing an exemplary threshold difference map displaying difference values to overlap on the map of the flash memory.

Referring to FIG. 12, an effect similar to that of the display shown in FIG. 11 can be attained by displaying difference values to overlap on the map of the flash memory.

Figure 13:
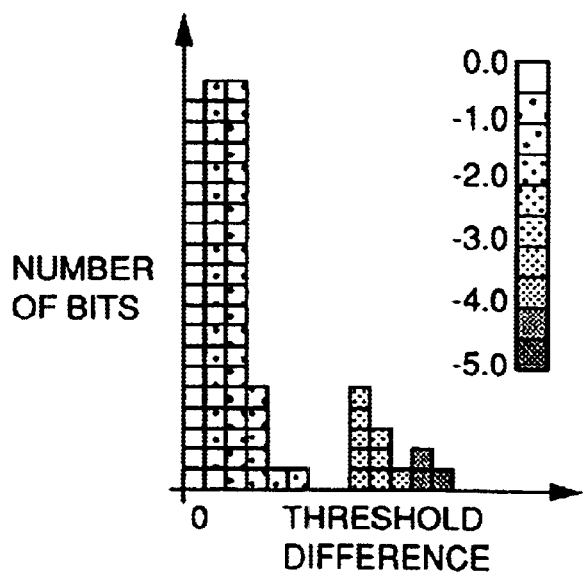
FIG. 13 illustrates an exemplary histogram of difference values.

Referring to FIG. 13, the data holdability of the flash memory can be quantitatively and visually expressed by displaying a histogram of the difference values.

Modification of Threshold Information Calculation Method

Figure 14:
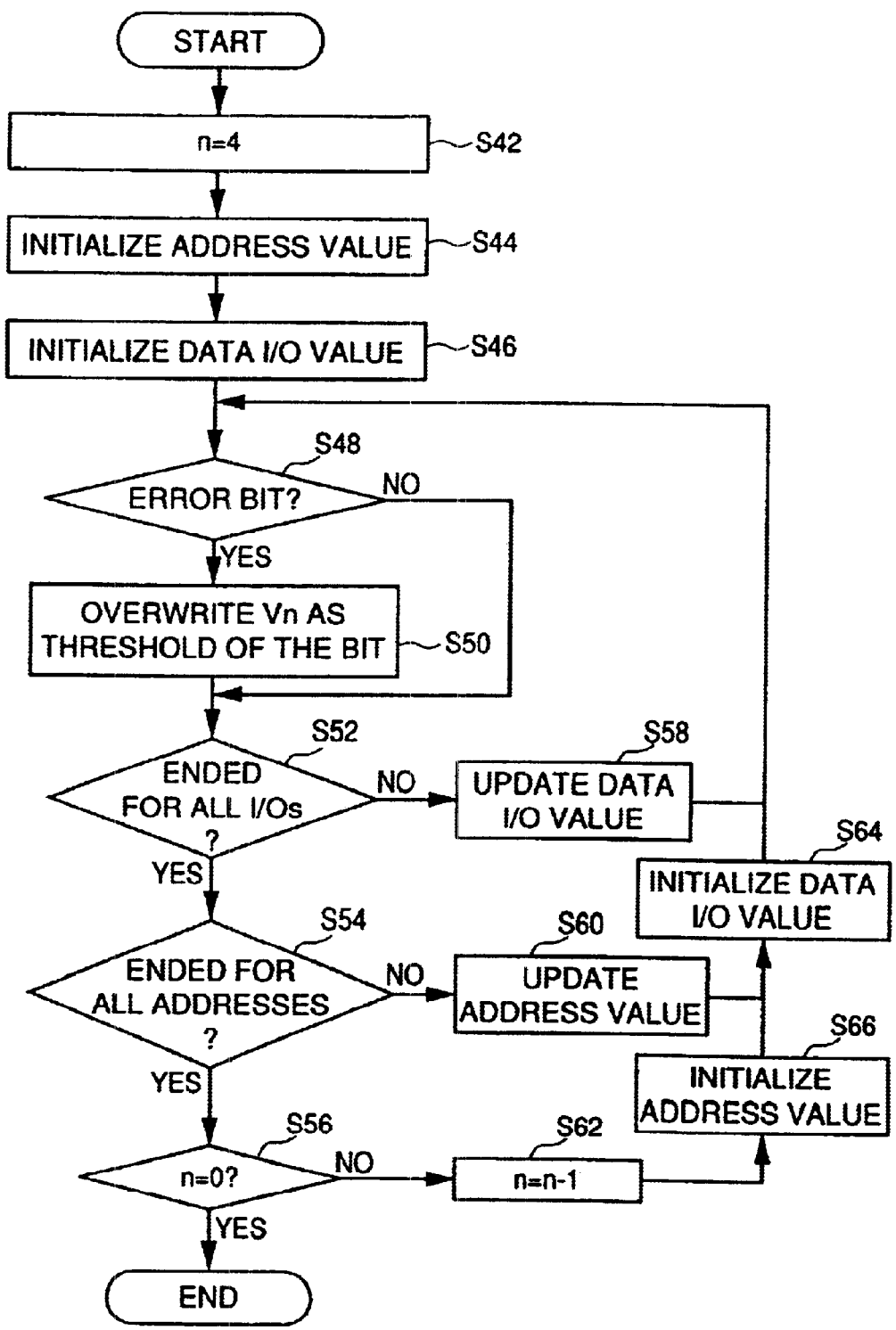
FIG. 14 is a flow chart of processing for obtaining threshold information.

In place of the processing at S4 in FIG. 2 described with reference to FIG. 4, the threshold information may be calculated by the following method:

Referring to FIG. 14, the CPU 24 initializes the variable n for specifying the word line applied voltage to 4 (S24). The CPU 24 initializes the address value for specifying a word and the data I/O value for specifying a bit in the word respectively (S44 and S46). In other words, the CPU 24 specifies the 0-th bit cell of the 0-th word. The CPU 24 examines whether or not the noted bit fails in data reading when applying the word line applied voltage Vn on the basis of the fail bit map information n (S48). When failing in data reading (YES at S48), the CPU 24 overwrites the word line applied voltage Vn as the threshold voltage of the bit (S50).

Otherwise (NO at S48) or after the processing at S50, the CPU 24 examines whether or not the processing is completed as to all data I/Os of the noted word (S52). If there is an unprocessed bit (NO at S52), the CPU 24 updates the data I/O value (S58) and repeats S48 and the subsequent processing.

If the processing is completed as to the noted word (YES at S52), the CPU 24 examines whether or not the processing is completed as to all addresses (all words) (S54). If there is an unprocessed address (No at S54), the CPU 24 updates the address value (S60), initializes the data I/O value (S64) and thereafter S48 and the subsequent processing.

If the processing is completed as to all addresses (YES at S54), the CPU 24 examines whether or not n=0 (S56). If n=0 (YES at S56), the CPU 24 ends the processing for obtaining threshold information.

If n≈0 (NO at S56), the CPU 24 decrements the variable n by 1, in order to obtain threshold information with the next fail bit map information (S62). Thereafter the CPU 24 initializes the address value and the data I/O value (S66 and S64), and repeats S48 and the subsequent processing.

Figure 15:
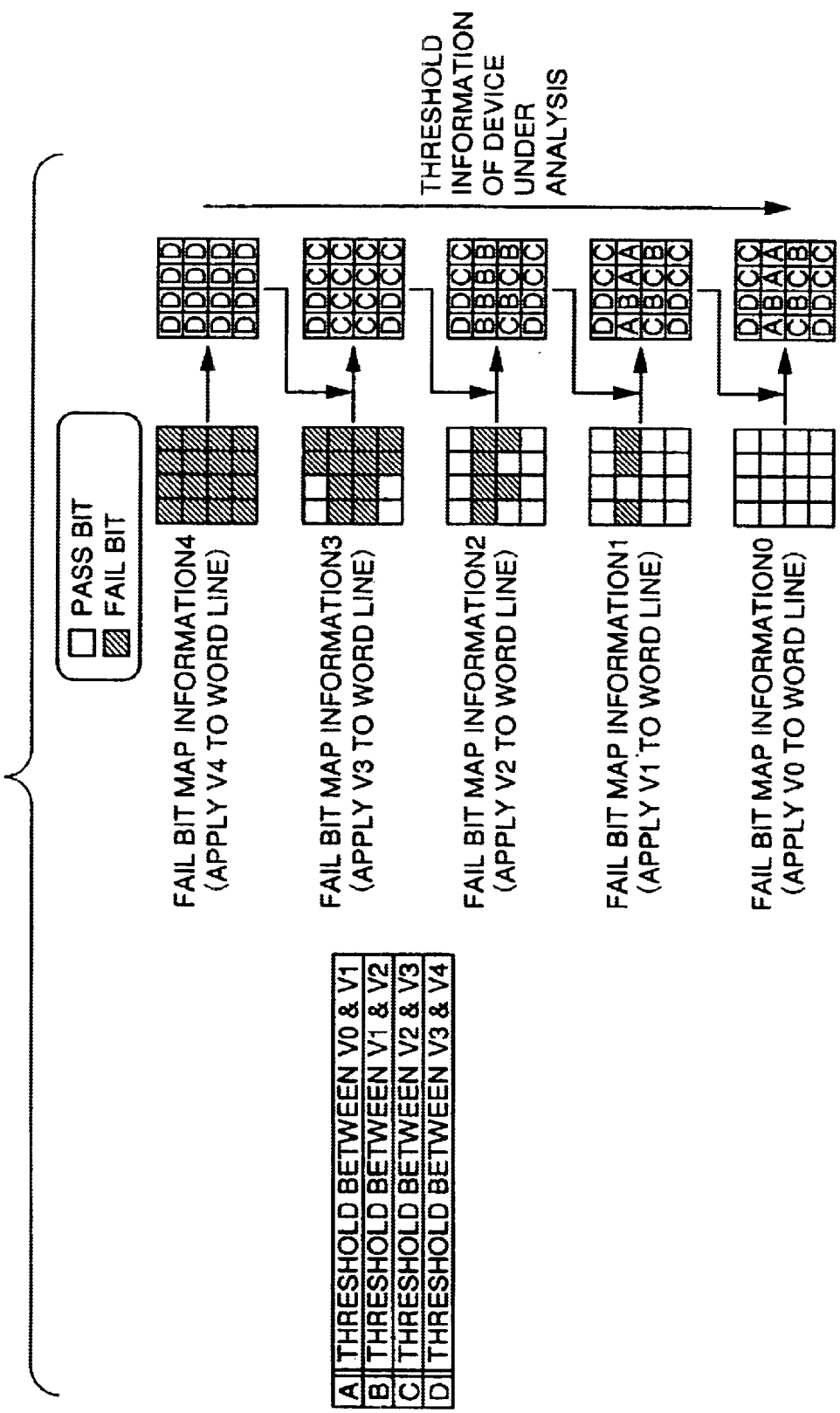
FIG. 15 is a diagram for illustrating the processing for obtaining threshold information.

It is assumed that fail bit map information shown in FIG. 15 is obtained, for example. It is also assumed that A to D represent threshold voltages in this case. When n=4, all bits fail in reading. Therefore, the threshold voltage D between the voltages V3 and V4 is supplied to all bits. When n=3, some bits succeed in reading. Therefore, the threshold voltages are left intact as to the bits exhibiting read values matching the determination value, while the threshold voltage C between the voltages V2 and V3 is overwritten as new threshold voltages as to the bits exhibiting read values mismatching the determination value. The CPU 24 repeats similar processing until the variable n reaches zero, for finally assigning any of the four threshold voltages A to D to each bit.

According to this embodiment, as hereinabove described, the threshold voltages for all bits in the DUT 30 can be obtained at once. Thus, the threshold voltages can be efficiently calculated.

Second Embodiment

Figure 16:
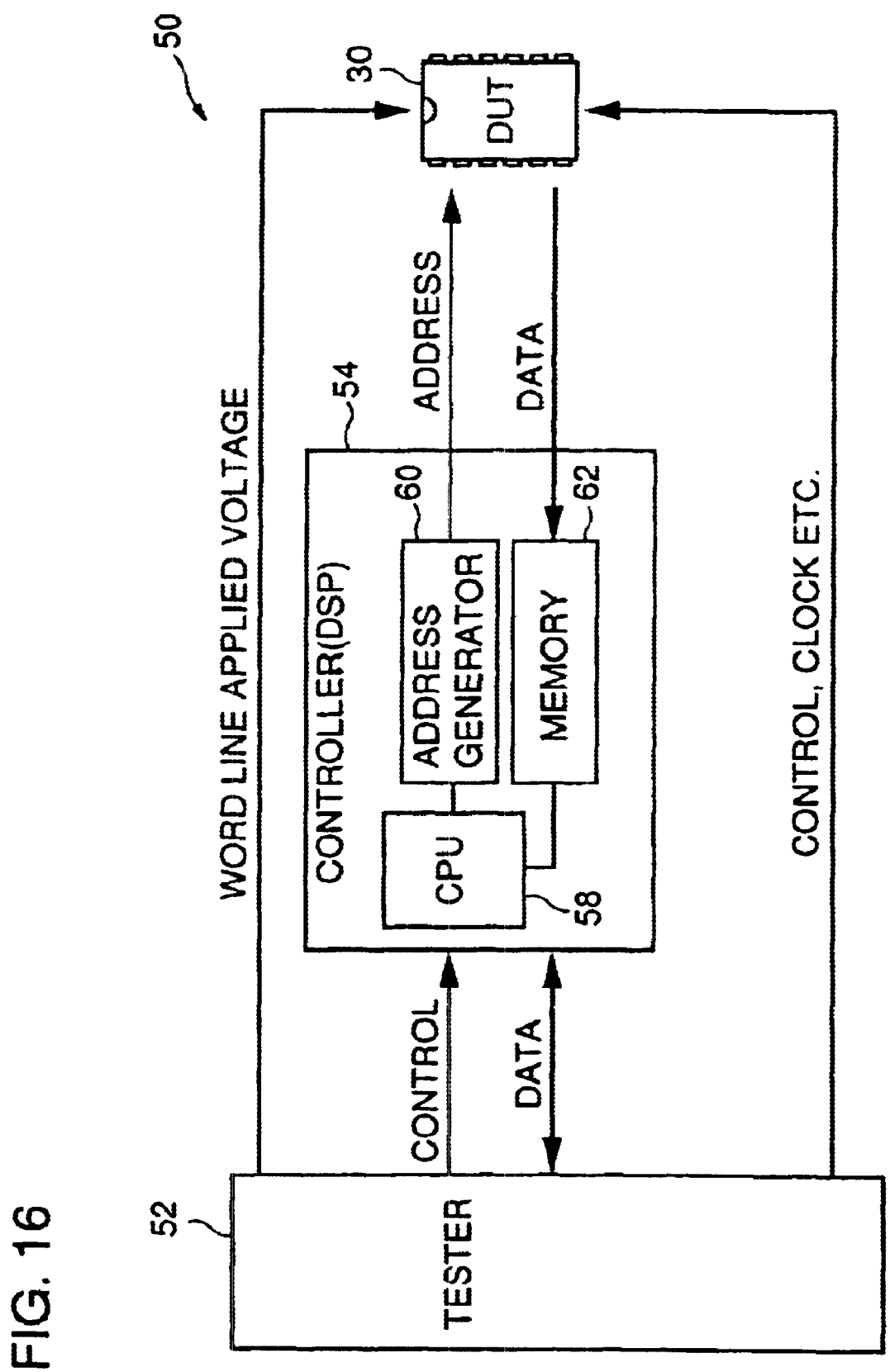
FIG. 16 is a block diagram showing the structure of a threshold analysis system according to a second embodiment of the present invention.

Referring to FIG. 16, a threshold analysis system 50 according to a second embodiment of the present invention includes a controller 54 connected to a DUT 30 for performing processing of calculating the threshold voltage of each cell forming the DUT 30 and a tester 52 connected to the DUT 30 and the controller 54 for controlling the controller 54 and supplying word line applied voltages to the DUT 30.

The controller 54 includes a memory 62 connected to the DUT 30 for storing data for threshold analysis, an address generator 60 generating an address signal and supplying the address signal to the DUT 30, and a CPU 58 connected to the address generator 60 and the memory 62 for controlling the address generator 60 and the memory 62 and calculating a threshold voltage for each bit forming the DUT 30.

The controller 54 is formed by a DSP (digital signal processor). An address pin, a data pin and a control pin of the DUT 30 are connected to an external port of the controller 54.

A method of calculating threshold information of each cell of the DUT 30 in the threshold analysis system 50 is similar to that shown in the first embodiment, and hence redundant description is not repeated.

Figure 17:
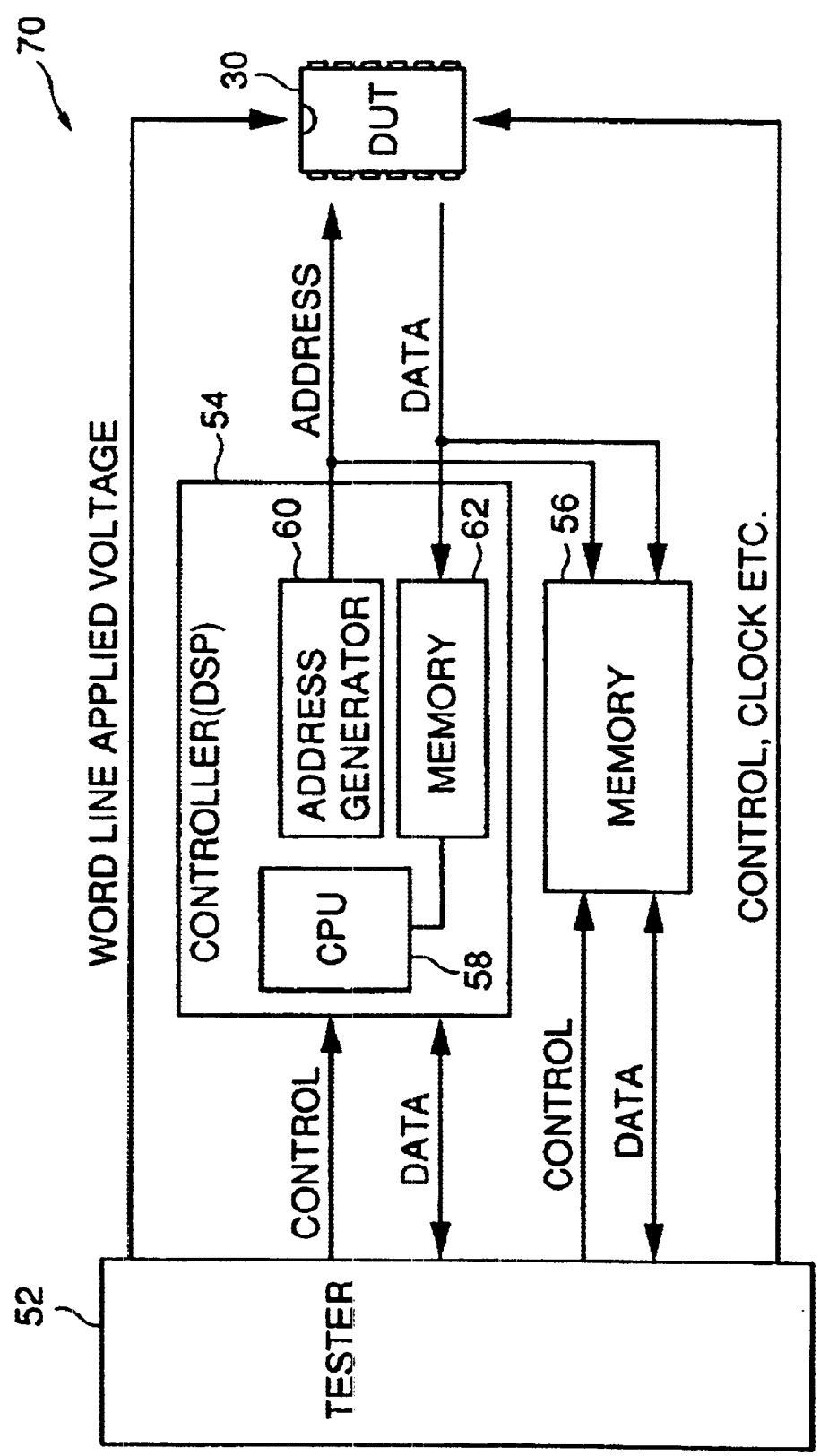
FIG. 17 is a block diagram showing the structure of a modification of the threshold analysis system according to the second embodiment of the present invention.

In addition to the structure of the threshold analysis system 50 shown in FIG. 16, a memory 56 may be provided as in a threshold analysis system 70 shown in FIG. 17. In this structure, the memory 56 is employed in place of the memory 62 provided in the controller 54, for storing data for threshold analysis.

According to this embodiment, the controller 54, represented by a DSP, having the CPU 58, the address generator 60 and the memory 62 on a single chip is employed. Therefore, threshold analysis can be executed without employing a high-priced address generator.

Third Embodiment

Figure 18:
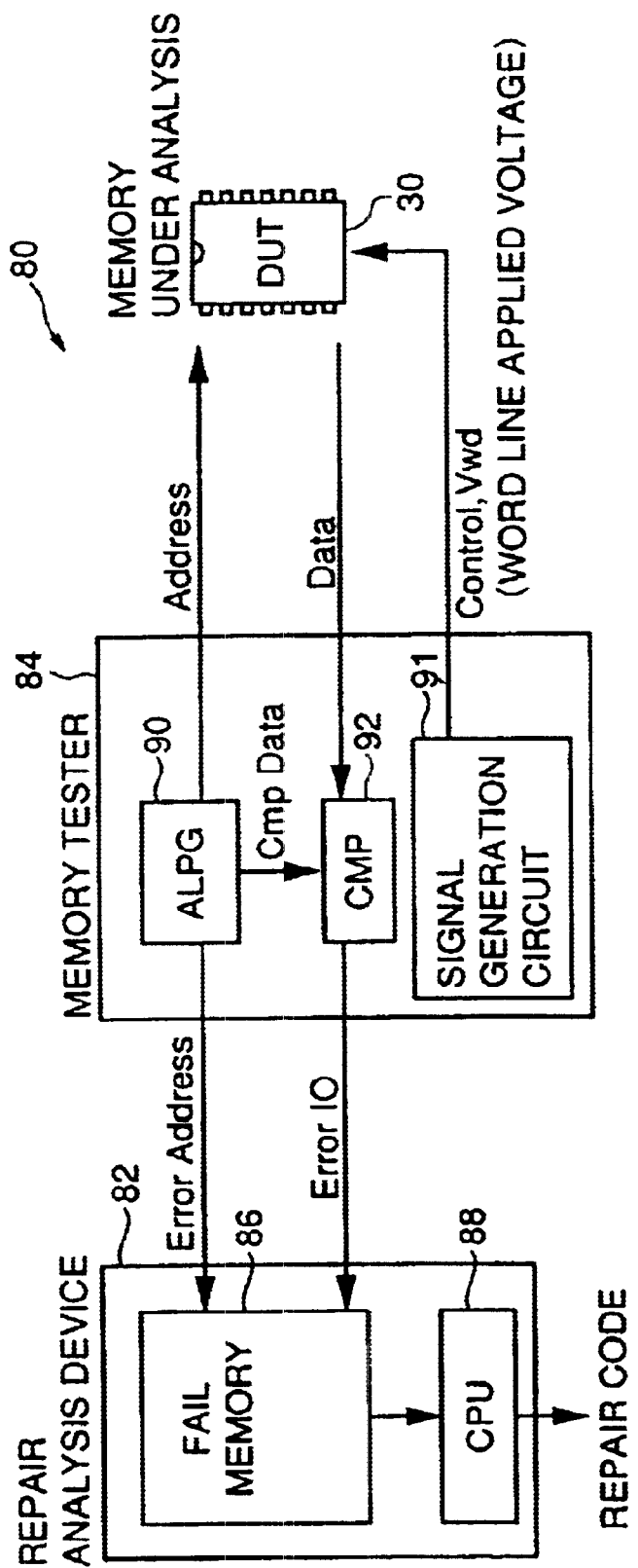
FIG. 18 is a block diagram showing the structure of a threshold analysis system according to a third embodiment of the present invention.

Referring to FIG. 18, a threshold analysis system 80 according to a third embodiment of the present invention includes a memory tester 84 supplying an address signal to a DUT 30 and reading data from the DUT 30 and a repair analysis device 82 connected to the memory tester 84 for receiving an address and a data I/O of a cell failing in reading, obtaining the threshold voltage of each cell of the DUT 30 and outputting information on a fail bit as a repair code.

The memory tester 84 includes an ALPG (algorithmic pattern generator) 90 supplying an address signal and a data signal to the DUT 30, a CMP (comparison circuit) 92 comparing the data generated by the ALPG 90 with data read from the DUT 30 bit by bit, and a signal generation circuit 91 supplying a control signal and a word line applied voltage to the DUT 30.

The repair analysis device 82 includes a fail memory 86 storing fail bit map information created on the basis of the address of the fail bit and the data I/O received from the memory tester 84 and a CPU 88 connected to the fail memory 86 for obtaining threshold information from the fail bit map information and outputting the repair code.

Figure 19:
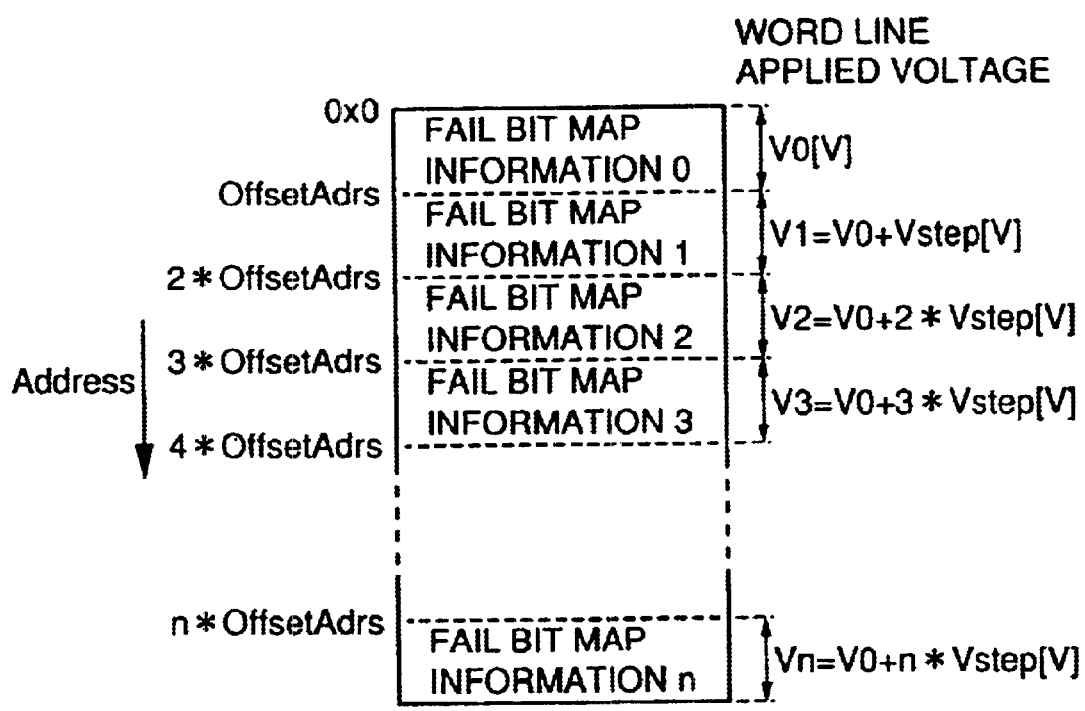
FIG. 19 is a diagram for illustrating a method of storing fail bit map information in a fail memory.

Referring to FIG. 19, the fail memory 86 sequentially stores fail bit map information for each word line applied voltage. A piece of fail bit map information necessarily occupies an area of an address OffsetAdrs. Therefore, the head address of fail bit map information n corresponding to a word line applied voltage Vn, for example, is expressed by adding n×OffsetAdrs to the head address of fail bit map information 0.

A method of calculating threshold information of each cell forming the DUT 30 in the threshold analysis system 80 is similar to that described with reference to the first embodiment, and hence redundant description is not repeated here.

According to this embodiment, the memory tester 84 and the repair analysis device 82 form the threshold analysis system 80. Therefore, threshold analysis can be performed with general purpose devices.

Fourth Embodiment

Figure 20A:
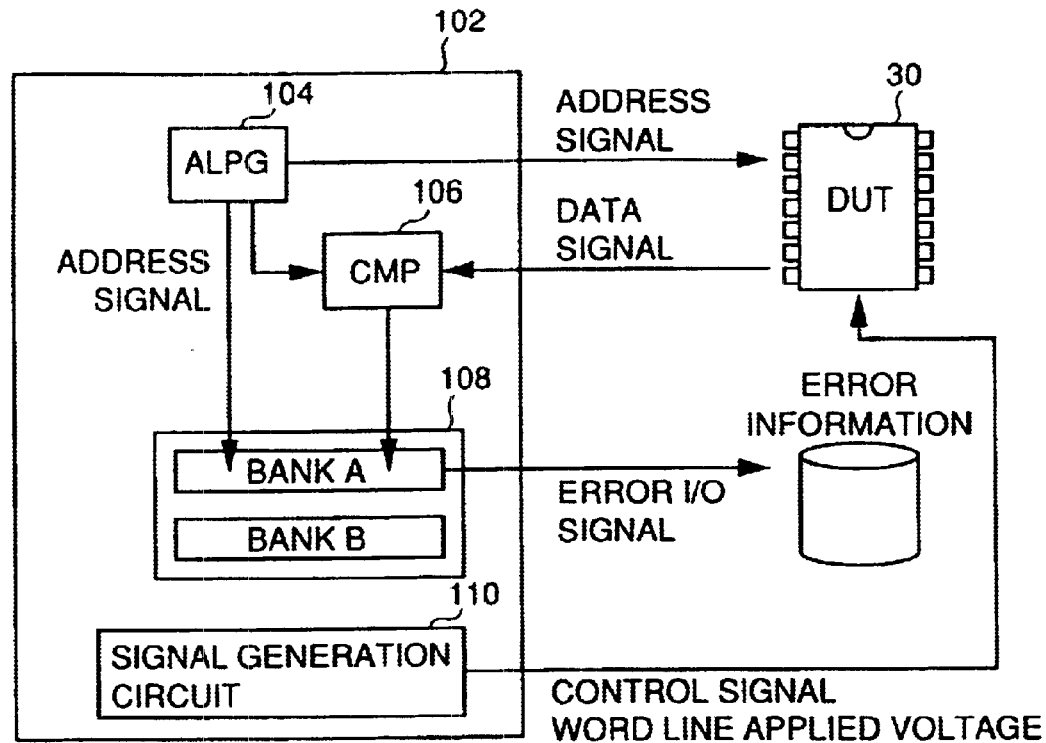
FIGS. 20A and 20B are block diagrams showing the structure of a threshold analysis system according to a fourth embodiment of the present invention.

Referring to FIG. 20A, a threshold analysis system according to a fourth embodiment of the present invention includes a memory tester 102 supplying an address signal to a DUT 30, reading data from the DUT 30 and obtaining the threshold voltage of each cell forming the DUT 30 on the basis of the read data.

The memory tester 102 includes an ALPG 104 supplying the address signal and a data signal to the DUT 30, a CMP (comparison circuit) 106 comparing data generated by the ALPG 104 with the data read from the DUT 30 bit by bit, an error catch RAM (random access memory) 108 connected to the ALPG 104 and the CMP 106 for storing fail bit map information based on the address signal and the result of comparison in the CMP 106, and a signal generation circuit 110 supplying a control signal and word line applied voltages to the DUT 30.

Figure 20B:
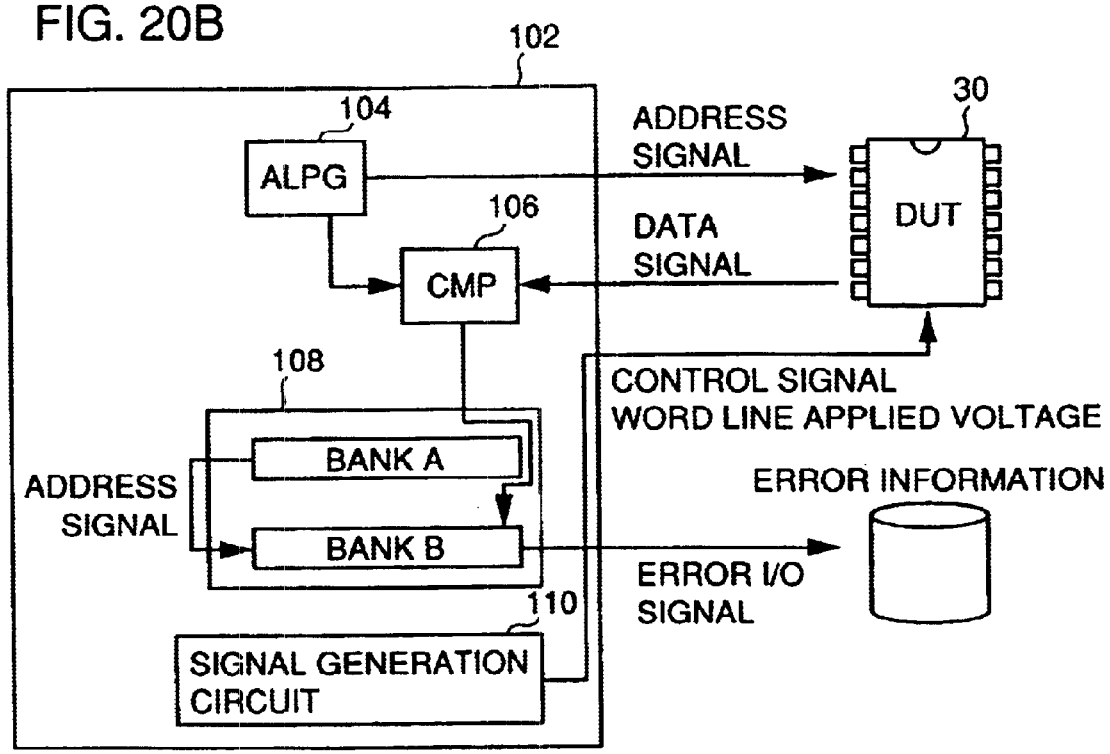

The error catch RAM 108 has a two-bank structure with banks A and B. First, a word line applied voltage V0 is applied and fail bit map information is written in the bank A. Referring to FIG. 20B, fail bit map information is written in a bank different from that used for creating preceding fail bit map information when creating second or subsequent fail bit map information. When creating fail bit map information, a preceding fail bit map is referred to not to perform data reading as to a bit determined as a fail bit in preceding data reading.

Processing for creating threshold information is similar to the method described with reference to the first embodiment, and hence redundant description is not repeated here.

In the threshold analysis system according to this embodiment, as hereinabove described, the memory 102 storing fail bit map information has a two-bank structure. Therefore, threshold information can be created while reducing the number of times for accessing the DUT 30. Thus, the threshold information can be obtained at a high speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A threshold analysis system including:
   a signal generation circuit generating a plurality of types of voltages and sequentially applying each of said plurality of types of voltages to a plurality of cells forming a memory device;
   an address generator sequentially generating address signals specifying the respective ones of said plurality of cells;
   a memory storing data read from said memory device as fail bit map information as to each of said plurality of types of voltages; and
   a threshold voltage calculation part connected to said memory for calculating threshold voltages of said plurality of cells forming said memory device from a plurality of pieces of fail bit map information corresponding to said plurality of types of voltages.

2. The threshold analysis system according to claim 1, wherein said signal generation circuit and said address generator are formed by a signal generation circuit and a pattern generator included in a memory tester respectively, and
   said memory and said threshold voltage calculation part are formed by a fail memory and a central processing unit included in a repair analysis device respectively.

3. The threshold analysis system according to claim 2, wherein each of said plurality of pieces of fail bit map information has a prescribed size and is stored in a continuous area of said fail memory.

4. The threshold analysis system according to claim 1, wherein said memory has a two-bank memory structure for alternating banks every time a voltage applied to said memory device is changed and writing fail bit map information in one of said banks with reference to fail bit map information stored in another said bank.

5. The threshold analysis system according to claim 1, wherein said signal generation circuit is formed by a signal generation circuit included in a memory tester, and
   said address generator and said threshold voltage calculation part are formed by a digital signal processor.

6. The threshold analysis system according to claim 1, further including a threshold display part connected to said threshold voltage calculation part for visually displaying said threshold voltages of said plurality of cells.

7. The threshold analysis system according to claim 6, wherein said threshold display part includes a histogram display part displaying a histogram of said threshold voltages.

8. The threshold analysis system according to claim 6, wherein said threshold display part includes:
   a representative value calculation part obtaining a value representing said memory device on the basis of a plurality of threshold voltages obtained from said plurality of cells respectively as to each of a plurality of memory devices present on a wafer, and
   a display part connected to said representative value calculation part for displaying each of said plurality of memory devices present on said wafer in a mode capable of specifying the position on said wafer and said difference value.

9. The threshold analysis system according to claim 6, wherein said threshold display part includes a display part displaying each of said plurality of cells in a mode capable of specifying the position in said memory device and the threshold voltage.

10. The threshold analysis system according to claim 6, wherein said threshold display part includes a graph display part displaying a graph having the relation between a prescribed parameter and said threshold voltages.

11. The threshold analysis system according to claim 6, wherein said threshold display part includes:
   a difference value calculation part calculating a difference value between threshold voltages obtained in two states having different conditions as to each of said plurality of cells, and
   a difference value display part connected to said difference value calculation part for visually displaying said difference value.

12. The threshold analysis system according to claim 11, wherein said difference value display part includes a difference value histogram display part displaying a histogram of said difference value.

13. The threshold analysis system according to claim 11, wherein said difference value display part includes a display part displaying each of said plurality of cells in a mode capable of specifying the position in said memory device and said difference value.

14. A threshold analysis method employed in a threshold analysis system including:
- a signal generation circuit generating a plurality of types of voltages and sequentially applying each of said plurality of types of voltages to a plurality of cells forming a memory device;
- an address generator sequentially generating address signals specifying the respective ones of said plurality of cells;
- a memory storing data read from said memory device as fail bit map information as to each of said plurality of types of voltages; and
- a threshold voltage calculation part connected to said memory for calculating threshold voltages of said plurality of cells forming said memory device from a plurality of pieces of fail bit map information corresponding to said plurality of types of voltages, said threshold analysis method including steps of:
- sequentially applying each of said plurality of types of voltages to said plurality of cells;
- sequentially generating said address signals specifying the respective ones of said plurality of cells;
- storing data read from said memory device as fail bit map information as to each of said plurality of types of voltages; and
- calculating threshold voltages of said plurality of cells forming said memory device from said plurality of pieces of fail bit map information stored in said memory.

15. The threshold analysis method according to claim 14, wherein said step of calculating said threshold voltages includes a step of examining said plurality of pieces of fail bit map information in order from a smaller voltage applied to said memory device when acquiring said fail bit map information for settling a threshold voltage as to a cell exhibiting read data first mismatching a predetermined determination value on the basis of said voltage applied to said memory device when acquiring said fail bit map information.

16. The threshold analysis method according to claim 14, wherein said step of calculating said threshold voltages includes a step of examining said plurality of pieces of fail bit map information in order from a larger voltage applied to said memory device when acquiring said fail bit map information for updating a threshold voltage as to a cell exhibiting read data mismatching a predetermined determination value on the basis of said voltage applied to said memory device when acquiring said fail bit map information.

* * * * *